United States Patent [19]

Bobbett et al.

[11] 4,424,491

[45] Jan. 3, 1984

[54] AUTOMATIC VOLTAGE IMBALANCE DETECTOR

[75] Inventors: Ronald E. Bobbett; J. Byron McCormick, both of Los Alamos, N. Mex.; William J. Kerwin, Tucson, Ariz.

[73] Assignee: The United States of America as represented by the United States Department of Energy, Washington, D.C.

[21] Appl. No.: 265,319

[22] Filed: May 20, 1981

[51] Int. Cl.³ ............................................. G01N 27/46
[52] U.S. Cl. .................................... 324/433; 324/434; 324/140 D; 429/23
[58] Field of Search ............... 324/433, 434, 430, 429, 324/439, 140 R, 140 D; 429/22, 23, 61; 320/48; 340/636; 429/90-93

[56] References Cited

U.S. PATENT DOCUMENTS

| 2,823,351 | 2/1958 | Page | 324/140 D |
| 3,580,741 | 5/1971 | Hovidus et al. | 429/23 |
| 4,134,060 | 1/1979 | Feldman | 324/434 |

OTHER PUBLICATIONS

"Fill it up with Methyl," Atom, Jan./Feb. 1980, pp. 3-7, Los Alamos National Laboratory.

Primary Examiner—Michael J. Tokar
Assistant Examiner—Kevin D. O'Shea
Attorney, Agent, or Firm—Paul D. Gaetjens; Leonard C. Brenner; Richard G. Besha

[57] ABSTRACT

A device for indicating and preventing damage to voltage cells such as galvanic cells and fuel cells connected in series by detecting sequential voltages and comparing these voltages to adjacent voltage cells. The device is implemented by using operational amplifiers and switching circuitry is provided by transistors. The device can be utilized in battery powered electric vehicles to prevent galvanic cell damage and also in series connected fuel cells to prevent fuel cell damage.

3 Claims, 2 Drawing Figures

AUTOMATIC VOLTAGE IMBALANCE DETECTOR

This invention is the result of a contract with the Department of Energy (Contract No. W-7405-ENG-36).

BACKGROUND OF THE INVENTION

In recent years both the galvanic cell and fuel cell have been used as sources of portable low-voltage electrical energy. In both the galvanic cell and fuel cell, chemical energy is converted directly into electrical energy. To obtain useful working voltages, a number of these voltage cells must be connected in series. In this manner, each cell adds its voltage to the total voltage of the voltage cells in the string below it. The output voltage of each cell depends upon both the type of cell and materials used within the cell. For example, galvanic cells, such as the lead-acid storage battery, produce an open circuit voltage of approximately 2.2 volts per cell. The operating voltage of phospheric fuel cells, on the other hand, is approximately 0.6 volts per cell.

The concept of connecting voltage cells in series to produce a useful working voltage is easily accomplished as long as the performance of each voltage cell closely matches the performance of the other cells in the stack. However, if for some reason a voltage cell does not perform in the same manner as the other cells in the group and presents a higher impedance to the current flowing through it, localized heating may occur within the cell which can cause permanent damage to the cell. In some cases, the cell polarization reverses which can produce a potentially dangerous situation. Performance imbalance, localized heating, and reversal of cell polarization readily occur in galvanic cells which are deeply discharged, such as, in battery powered or battery assisted electric vehicles which are forced to go beyond the designed operating parameters of the batteries. This condition can also occur in fuel cells when improper cooling exists or when an insufficient supply of reactants is provided. In most cases, permanent damage can be prevented by simply reducing or eliminating the demand on the voltage cell whenever these conditions exist.

SUMMARY OF THE INVENTION

It is therefore an object of the present invention to provide a device for detecting an error voltage to indicate malfunction of at least one voltage cell in a plurality of voltage cells connected in series.

It is also an object of the present invention to provide a device for detecting voltage imbalances in a plurality of voltage cells connected in series.

Another object of the present invention is to provide an automatic voltage imbalance detector.

Another object of the present invention is to provide a device for preventing damage to series connected voltage cells due to excessive discharge.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects, and in accordance with the purposes of the present invention, as embodied and broadly described herein, the apparatus of this invention may comprise a device for detecting an error voltage to indicate malfunction of at least one voltage cell in a plurality of voltage cells connected in series comprising means for adding the voltage magnitudes of two adjacent voltage cells of said plurality of voltage cells connected in series at upper and lower voltage points to obtain a sum voltage; means for comparing said sum voltage with a central voltage between said two adjacent voltage cells to obtain an error voltage; switching means for providing an output whenever said error voltage exceeds a predetermined magnitude indicative of a malfunction of at least one of said voltage cells.

The present invention may also comprise, in accordance with its objects and purposes, a device for detecting voltage imbalances in a plurality of voltage cells connected in series comprising means for measuring the voltage difference across a first voltage cell; means for measuring the voltage difference across an adjacent voltage cell connected in series to said first voltage cell; means for comparing said voltage difference across said first voltage cell with said voltage difference across said adjacent voltage cell to produce an error voltage; switching means for producing an output signal whenever said error voltage exceeds a predetermined magnitude.

The present invention may also comprise, in accordance with its objects and purposes, an automatic voltage imbalance detector comprising a plurality of voltage cells connected in series such that each two adjacent voltage cells have lower, middle and upper voltage points at connection points in said series; means for combining the voltage magnitudes at said upper and lower voltage points to obtain a sum voltage; operational amplifier means for comparing said sum voltage with the voltage magnitude at said middle voltage point to produce an error signal proportional to the difference between said sum voltage and the voltage magnitude at said middle voltage point; switching means for producing an output signal whenever said comparison signal exceeds a predetermined error voltage.

The present invention may also comprise, in accordance with its objects and purposes, a device for preventing damage to series connected voltage cells due to excessive discharge comprising means for detecting voltage levels between said series connected voltage cells during discharge; means for comparing adjacent voltage levels to produce difference voltage signals; means for comparing adjacent difference voltage signals to produce an error voltage signal proportional to the difference between said difference voltage signals; switching means for producing an output switching signal whenever said error voltage signal exceeds a predetermined absolute magnitude indicative of potential damage to said voltage cells.

The advantages of the present invention are that it provides a mechanism for monitoring a power system and preventing damage resulting from an excessive voltage drop in any particular cell compared to the surrounding voltage cells. The system can be implemented to automatically reduce or eliminate system load to prevent damage. Another important advantage of the present invention is that no prior guesswork is necessary for preventing the conditions that may cause cell damage. That is, any condition that may cause a cell voltage to drop, such as loss of fuel or a decrease in chemical reactivity, is automatically detected by measuring voltage imbalances. Moreover, the readings are independent of system load since the error signal represents a comparison between adjacent voltage cells.

BRIEF DESCRIPTION OF THE DRAWINGS

The accompanying drawings, which are incorporated in, and form a part of, the specification, illustrate an embodiment of the present invention and, together with the description, serve to explain the principles of the invention. In the drawings.

DETAILED DESCRIPTION OF THE PREFERRED EMBODIMENT OF THE INVENTION

Figure 1:
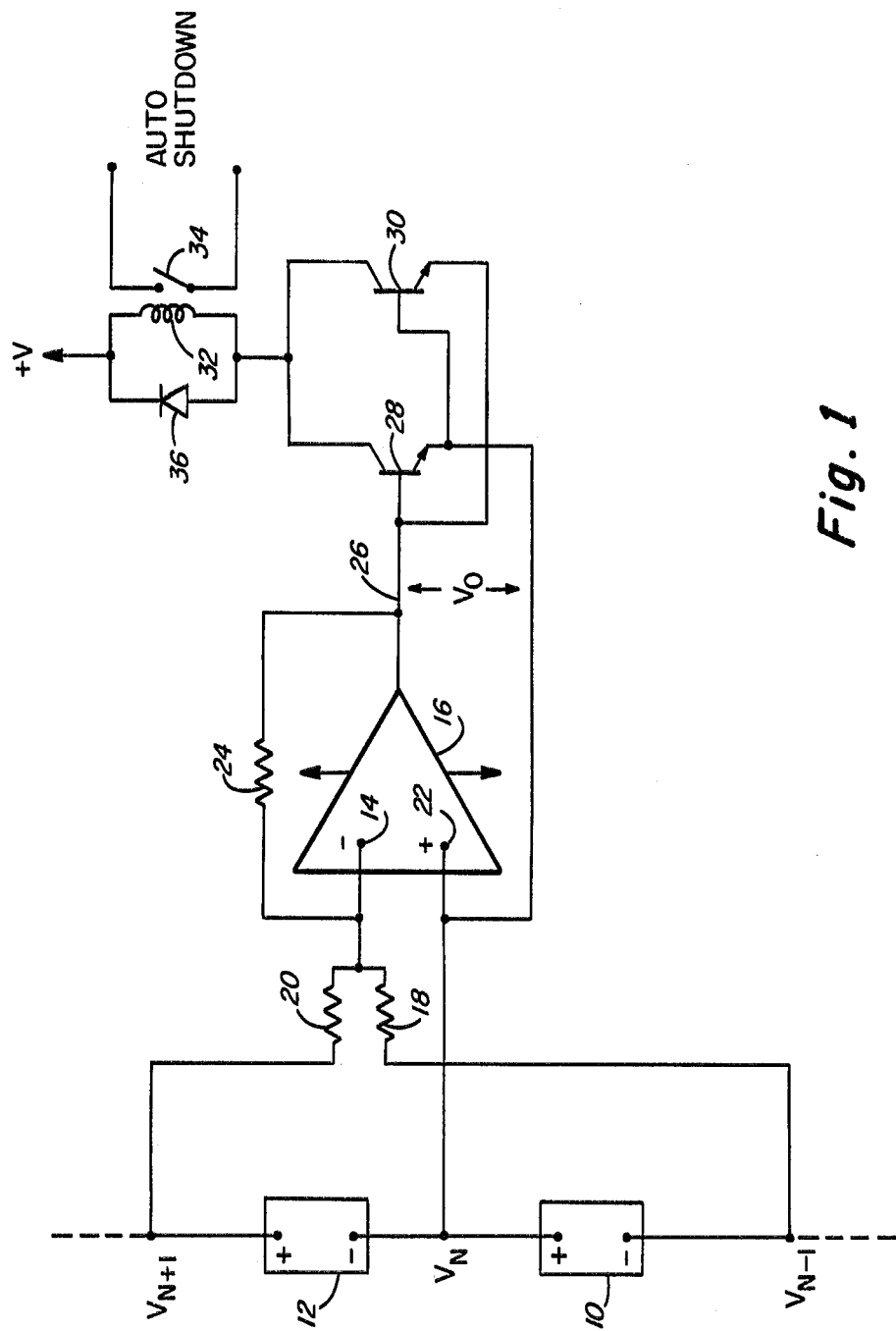
FIG. 1 is a schematic diagram illustrating the important operating components of the device of the present invention.

FIG. 1 schematically illustrates the concept of the present invention. The underlying principle of the voltage imbalance detection circuit of the present invention is that the voltage difference, or imbalance between adjacent groups of voltage cells, such as voltage cells 10 and 12 having equal outputs must not exceed a predetermined error voltage which has been found to be indicative of a failure in one or more of the cells connected in series. For example, if one cell group in a series of fuel cells develops 5.5 V and an adjacent cell group develops 6.5 V under the same load, there is good reason to suspect that one of the groups has one or more bad cells. The same is true for series connected galvanic cells. Since the output voltage of an electrochemical cell is a function of the load current, it is not possible to detect a bad cell simply by comparing the voltage of that cell to some standard voltage. Consequently, the comparison must be made between adjacent voltage cells or groups of voltage cells along the entire system string. If the output voltage of a group n is equal $V_n$, and the output voltage of the group immediately following group n in the series is $V_{n+1}$, and the output voltage of the group immediately preceeding group n is $V_{n-1}$, then an error voltage, denoted as $E_v$, can be defined as follows:

$$|(V_n - V_{n-1}) - (V_{n+1} - V_n)| \leq E_v \qquad (1)$$

In other words, if the absolute voltage difference between adjacent cells groups is less than or equal to an acceptable error voltage ($E_v$), then the cell group voltages are acceptable. Since all of the voltage cells are subjected to the same external load, the relationship of equation 1 is not affected by the load. This allows for continuous monitoring of the voltage cells and an immediate indication of a potential damage situation. Where more than one comparison circuit is used for monitoring three or more voltage cells, the present invention provides a redundancy since a bad cell or cell group will indicate a failure in the comparison circuit for voltage cells or cell groups immediately prior to and following the particular voltage cell in question. This is true for all of the voltage cells connected in series, except for the first and last voltage cell.

Equation 1 can also be rewritten as follows:

$$\left/ V_n - \frac{(V_{n-1} + V_{n+1})}{2} \right/ \leq E_v/2 \qquad (2)$$

This form of the equation clearly shows that the left side of the relationship is a measure of the departure of the predicted value of $V_n$ based on the average of $V_{n-1}$ and $V_{n+1}$, with the actual value of $V_n$.

Referring again to FIG. 1, the voltages $V_{n-1}$ and $V_{n+1}$ are applied to the negative input 14 of operational amplifier 16 via input resistors 18 and 20. The central voltage, $V_n$, is applied directly to positive input 22 of operational amplifier 16 and provides a standard voltage to which the combined voltages $V_{n-1}$ and $V_{n+1}$ are compared. Feedback resstor 24 functions to make operational amplifier 16 operate as a voltage dividing circuit for the voltage applied to negative input 14. The voltage at output 26 is a value of the comparison of the combined voltages applied to negative input 14 with the central voltage applied to positive input 22 of operational amplifier 16. The magnitude of the voltage at output 26 can be adjusted by the relative magnitudes of resistors 18, 20, and 24. Transistors 28 and 30 operate as switching devices for providing an automatic shutdown signal whenever a predetermined voltage is exceeded at output 26. Since the output voltage, $V_o$ is a comparison between $V_n$ and the voltage at output 26, as illustrated in FIG. 1, whenever the voltage at output 26 exceeds the turn-on voltage of the base/emitter junction of transistor 28, transistor 28 begins to conduct which causes current to flow through coil 32 causing relay switch 34 to close and thereby provide an automatic shutdown signal. The base/emitter junction of transistor 30 is connected exactly opposite to the base/emitter junction of transistor 28, so that when the voltage at output 26 exceeds a predetermined error voltage in a negative direction compared to voltage $V_n$, transistor 30 conducts causing the same function to occur in coil 32 and relay switch 34.

Of course, transistors can be combined with diodes and/or zener diodes to generate various selected turn-on thresholds to provide a different predetermined voltage. However, the easiest manner of adjusting the voltage required to turn on transistors 28 and 30 is by way of selecting resistors 18, 20, and 24. If resistors 18, 20, and 24 are made essentially equal in value, the predetermined voltage will be essentially equal to the turn-on voltage of the base emitter junction of transistors 28 and 30. In many cases this is essentially equal to 0.6 V, which is approximately the desired error voltage for 6.0 V galvanic cell batteries connected in series and a 6.0 V group (normally 10) of fuel cells connected in series. This provides a very convenient circuit which can be constructed with greater ease and at a lesser expense.

Figure 2:
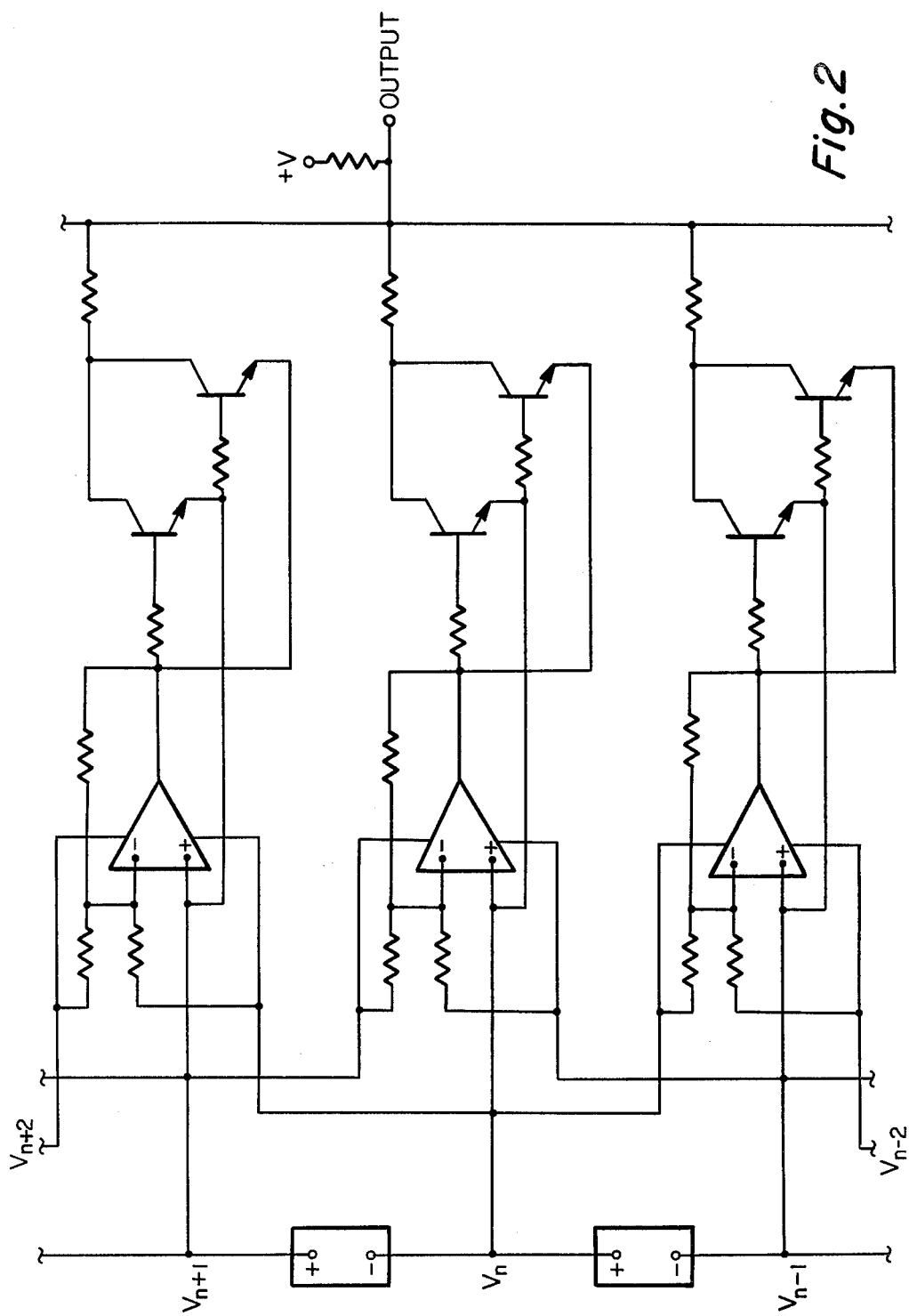
FIG. 2 is a detailed schematic diagram of the manner in which the device of the present invention is implemented with a plurality of series connected voltage cells.

FIG. 2 schematically illustrates the concept of a complete circuit which consists of multiples of the fundamental circuit illustrated in FIG. 1. Each cell group output such as $V_{n-1}$, $V_n$, $V_{n+1}$, except for the last or total voltage is connected to a fundamental circuit. Each of the fundamental circuit outputs are connected together and to an additional circuit or device to generate an alarm signal or initiate a remedial or shutdown action if any one of the switching transistors is caused to turn on by detection of a voltage imbalance within the string of voltage cells.

Consequently, the present invention provides a device for detecting an error voltage to indicate malfunction of at least one voltage cell in a plurality of voltage cells connected in series. The device of the present invention can be implemented to reduce the output load to the series connected voltage cells or inhibit discharge of the voltage cells altogether. The device of the present invention is capable of continuously monitoring the series connected voltage cells and providing a reliable output indicative of potential damage to one of the voltage cells during varying load conditions. This allows the device of the present invention to provide an instantaneous output signal whenever the error voltage exceeds a predetermined magnitude. The device of the present invention is also useful in battery-powered electric vehicles as a device for preventing galvanic cells from becoming damaged by being overly discharged. Additionally, it provides an instantaneous indication of a malfunction within fuel cells and can thereby prevent costly damage to these devices.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A device for indicating malfunction of at least one voltage cell in a plurality of voltage cells connected in series comprising:
   means for adding the voltage magnitudes of two adjacent voltage cells of said plurality of voltage cells connected in series at upper and lower voltage points to obtain a sum voltage;
   means for comparing said sum voltage with a central voltage between said two adjacent voltage cells to obtain an error voltage proportional to the difference between said sum voltage and said central voltage; and
   switching means for providing an output whenever said error voltage exceeds a predetermined magnitude indicative of a malfunction of at least one of said voltage cells, said switching means having a first transistor connected to conduct whenever said error signal exceeds a predetermined positive voltage and a second transistor connected to conduct whenever said error signal exceeds a predetermined negative voltage.

2. An automatic voltage imbalance detector comprising:
   a plurality of voltage cells connected in series such that each two adjacent voltage cells have lower, middle and upper voltage points at connection points in said series;
   means for combining the voltage magnitudes at said upper and lower voltage points to obtain a sum voltage;
   operational amplifier means for comparing said sum voltage with the voltage magnitude at said middle voltage point to produce an error signal proportional to the difference between said sum voltage and the voltage magnitude at said middle voltage point; and
   switching means for producing an output signal whenever said comparison signal exceeds a predetermined error voltage, said switching means having a first transistor connected to conduct whenever said error signal exceeds a predetermined positive voltage and a second transistor connected to conduct whenever said error signal exceeds a predetermined negative voltage.

3. A device for preventing damage to series connected voltage cells due to excessive discharge comprising:
   means for detecting voltage levels between said series connected voltage cells during discharge;
   means for comparing adjacent voltage levels to produce difference voltage signals;
   means for comparing adjacent difference voltage signals to produce an error voltage signal proportional to the difference between said difference voltage signals; and
   switching means for producing an output voltage switching signal whenever said error voltage signal exceeds a predetermined absolute magnitude indicative of potential damage to said voltage cells, said switching means having a first transistor connected to produce an output switching signal whenever said error voltage signal exceeds a predetermined positive voltage and a second transistor connected to produce an output switching signal whenever said error voltage signal exceeds a predetermined negative voltage.

* * * * *